(12) United States Patent
Yang et al.

(10) Patent No.: US 11,804,514 B2
(45) Date of Patent: Oct. 31, 2023

(54) ARRAY SUBSTRATE AND LIGHT FIELD DISPLAY DEVICE WITH OVERLAPPING SIGNAL LINES

(71) Applicant: BOE TECHNOLOGY GROUP CO., LTD., Beijing (CN)

(72) Inventors: Ming Yang, Beijing (CN); Can Zhang, Beijing (CN); Minghua Xuan, Beijing (CN); Liang Chen, Beijing (CN); Xiaochuan Chen, Beijing (CN); Wenqing Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 240 days.

(21) Appl. No.: 17/212,158

(22) Filed: Mar. 25, 2021

(65) Prior Publication Data

US 2021/0210548 A1 Jul. 8, 2021

Related U.S. Application Data

(63) Continuation of application No. 16/638,703, filed as application No. PCT/CN2019/079286 on Mar. 22, (Continued)

(30) Foreign Application Priority Data

Nov. 13, 2018 (CN) .......................... 201811345869.4

(51) Int. Cl.
*H01L 27/15* (2006.01)
*H01L 33/38* (2010.01)
(Continued)

(52) U.S. Cl.
CPC ............. *H01L 27/156* (2013.01); *G09G 3/32* (2013.01); *H01L 33/38* (2013.01); *H01L 33/62* (2013.01)

(58) Field of Classification Search
CPC .......... H01L 27/3276; H01L 2227/323; H01L 27/156; H01L 33/38; H01L 33/62; H04N 13/302; G09G 3/32
See application file for complete search history.

(56) References Cited

U.S. PATENT DOCUMENTS 11,398,540 B2 * 7/2022 Yang .................... H01L 27/3276
2012/0140131 A1 * 6/2012 Lanman ................. H04N 13/32
349/15
(Continued)

FOREIGN PATENT DOCUMENTS

CN 103296033 A 9/2013
CN 104280912 A 1/2015
(Continued)

OTHER PUBLICATIONS

English translation of International Search Report of PCT/CN2019/079286, dated Jul. 25, 2019.
(Continued)

*Primary Examiner* — Lex H Malsawma
(74) *Attorney, Agent, or Firm* — Collard & Roe, P.C.

(57) ABSTRACT

An array substrate is provided, including a substrate, wherein the substrate is provided with a plurality of electrodes and a plurality of first signal lines, each of the electrodes being correspondingly connected with a first signal line. In some examples, the first signal lines extend in the same direction. In some examples, at least two of the plurality of first signal lines are located in different layers of an insulating spacer from each other. In some examples, orthographic projections on the substrate of at least two of the first signal lines in the different layers at least partially overlap. Accordingly, a light field display device comprising the array substrate is also provided. The array substrate can
(Continued)

reduce a light-emitting point size and increase a density distribution of light-emitting points.

20 Claims, 12 Drawing Sheets

Related U.S. Application Data 2019, now Pat. No. 11,398,540, and a continuation of application No. PCT/CN2019/079286, filed on Mar. 22, 2019.

(51) Int. Cl.
*G09G 3/32* (2016.01)
*H01L 33/62* (2010.01)

(56) References Cited

U.S. PATENT DOCUMENTS

| | | |
|---|---|---|
| 2013/0093983 A1 | 4/2013 | Kizu et al. |
| 2015/0318305 A1 | 11/2015 | Zhang et al. |
| 2016/0188063 A1* | 6/2016 | Kim ............... G06F 3/0412 345/173 |
| 2016/0252792 A1 | 9/2016 | Han et al. |
| 2017/0329190 A1 | 11/2017 | Chen et al. |
| 2020/0212071 A1 | 7/2020 | Guo et al. |
| 2020/0341573 A1 | 10/2020 | Yang |
| 2020/0348784 A1 | 11/2020 | Wu et al. |

FOREIGN PATENT DOCUMENTS

| | | |
|---|---|---|
| CN | 104598074 A | 5/2015 |
| CN | 105097843 A | 11/2015 |
| CN | 106444199 A | 2/2017 |
| CN | 106959783 A | 7/2017 |
| CN | 206470722 U | 9/2017 |
| CN | 107678590 A | 2/2018 |
| CN | 108257980 A | 7/2018 |
| CN | 108428705 A | 8/2018 |
| CN | 109461405 A | 3/2019 |
| WO | 2020/098200 A1 | 5/2020 |

OTHER PUBLICATIONS

English translation of Notice of Transmittal of the International Search Report of PCT/CN2019/079286, dated Jul. 25, 2019.
English translation of Written Opinion of the International Searching Authority of PCT/CN2019/079286, dated Jul. 25, 2019.
Chinese Office Action in Chinese Application No. 201811345869.4, dated Dec. 18, 2019 with English translation.
U.S. Office Action in U.S. Appl. No. 16/638,703 dated Dec. 20, 2021.

* cited by examiner

US 11,804,514 B2

ARRAY SUBSTRATE AND LIGHT FIELD DISPLAY DEVICE WITH OVERLAPPING SIGNAL LINES

CROSS REFERENCE TO RELATED APPLICATIONS

This application is a continuation application of U.S. patent application Ser. No. 16/638,703 filed on Feb. 12, 2020 which is a National Stage of PCT/CN2019/079286 filed on Mar. 22, 2019, which claims priority under 35 U.S.C. § 119 of Chinese Application No. 201811345869.4 filed Nov. 13, 2018. This application is also a continuation application of PCT/CN2019/079286 filed on Mar. 22, 2019, which claims priority under 35 U.S.C. § 119 of Chinese Application No. 201811345869.4 filed Nov. 13, 2018. The disclosures of these applications are incorporated herein by reference.

FIELD

The present description relates generally to the field of display technologies, and embodiments of an array substrate and a light field display device.

BACKGROUND AND SUMMARY

In recent years, light field display has become a burgeoning field of research. For example, light field display features prominently in the development of next-generation 3D display devices. In a conventional light field display device, a light-driven display unit utilizes a two-dimensional matrix, or array, composed of a plurality of light-emitting points, such as a pixel or a sub-pixel. A driving structure provides a driving signal for an electrode of the light-emitting point via a signal line, whereby the light-emitting point projects a beam of light according to the driving signal into space.

In order to improve a perceived display effect, the light field display device needs to be provided with a large number of light-emitting points. However, in current light field display devices, each light-emitting point is associated with a large number of signal lines, which makes it difficult to reduce the light-emitting point size. Consequently, it is difficult to increase the density distribution of the light-emitting points.

The present disclosure aims to solve or alleviate at least some of the technical problems existing in the prior art. To that end, embodiments of an array substrate and a light field display device are herein proposed which reduce a light-emitting point size and increase a density distribution of light-emitting points.

An embodiment of the present disclosure provides an array substrate, comprising a substrate, a plurality of electrodes, and a plurality of first signal lines on the substrate, wherein each of the plurality of electrodes is connected to one of the plurality of first signal lines, the plurality of first signal lines extends along a first direction, at least two first signal lines of the plurality of first signal lines are located in different layers of an insulating spacer from each other, and orthographic projections on the substrate of the at least two first signal lines in the different layers at least partially overlap.

Further, an embodiment of the present disclosure provides a light field display device comprising the array substrate.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure. Additionally, the summary above does not constitute an admission that the technical problems and challenges discussed were known to anyone other than the inventors.

DETAILED DESCRIPTION

The following description relates to an array substrate, or display, and a light field display device having the array substrate. The specific embodiments of the present invention will be described in detail below with reference to the accompanying figures. It is to be understood that the specific embodiments described herein are merely illustrative and not restrictive.

At least in part to improve a density distribution, or pixel resolution, of light-emitting points in the light field display device, the present disclosure provides the array substrate, which will be described below with reference to accompanying figures.

Figure 1A:
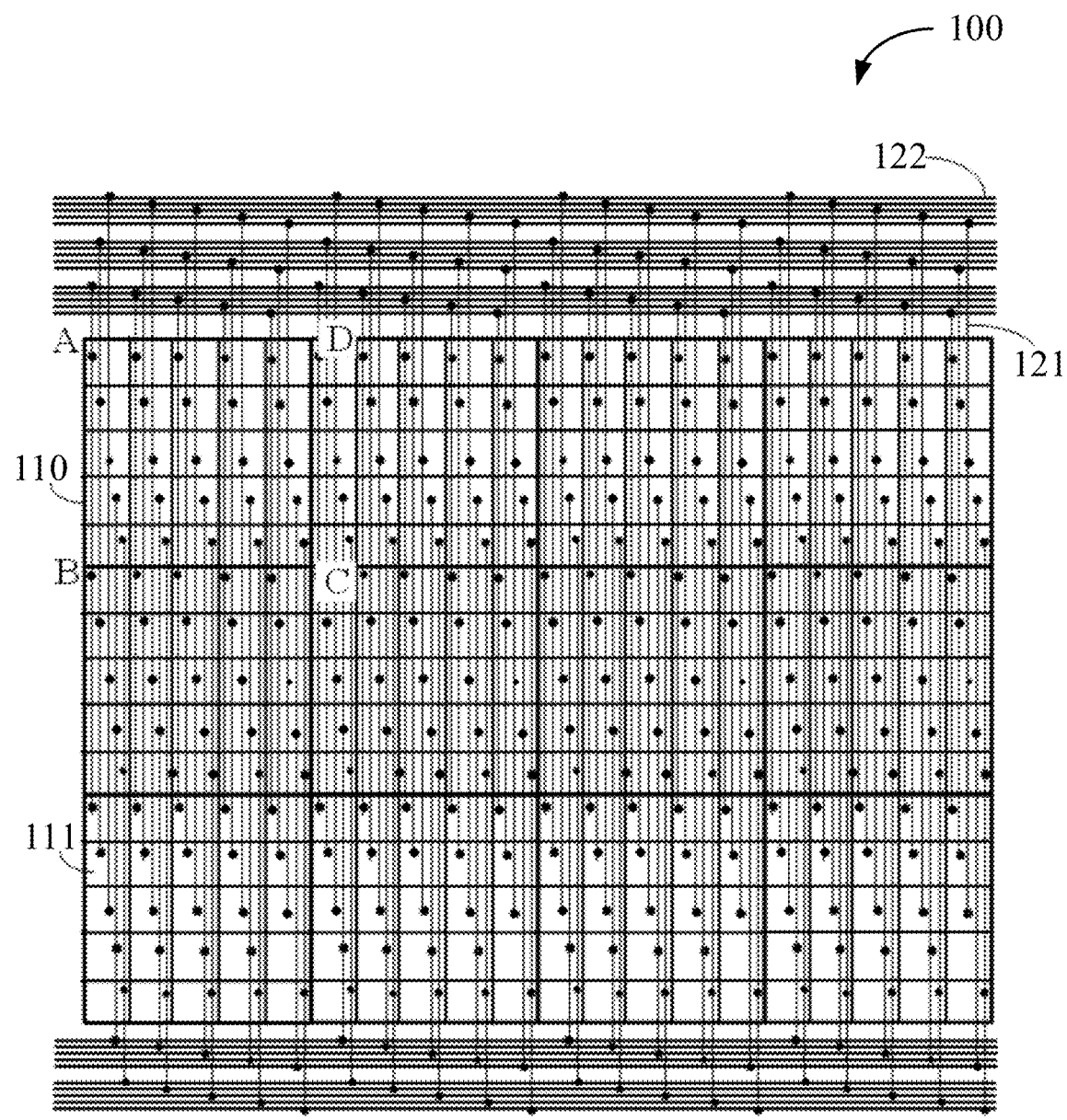
FIG. 1A shows a schematic diagram of wiring in a conventional light field display device.
Figure 1B:
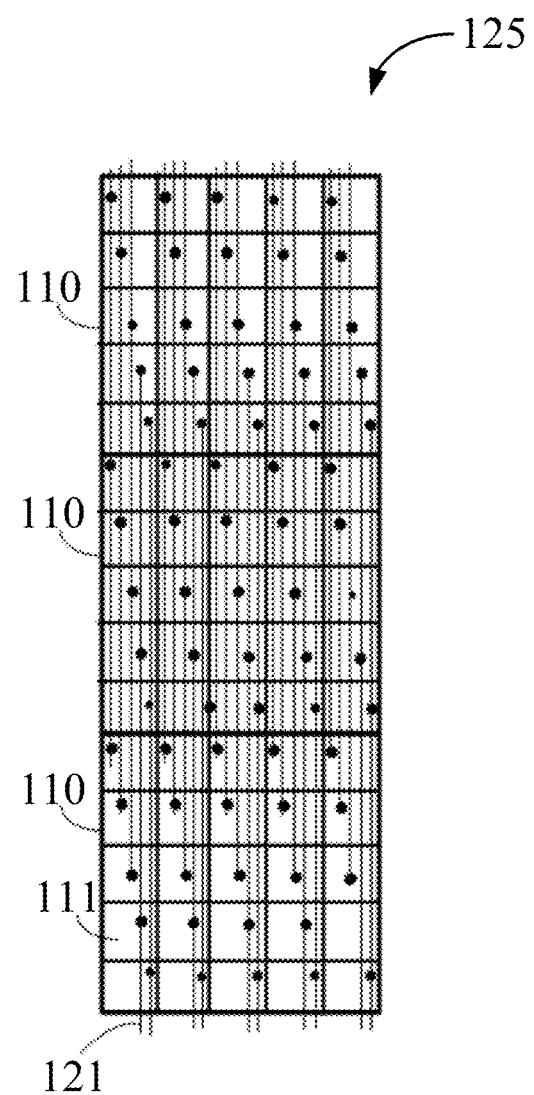
FIG. 1B shows a schematic diagram of wiring in three light-emitting units in a column of the conventional light field display device according to FIG. 1A.
Figure 1C:
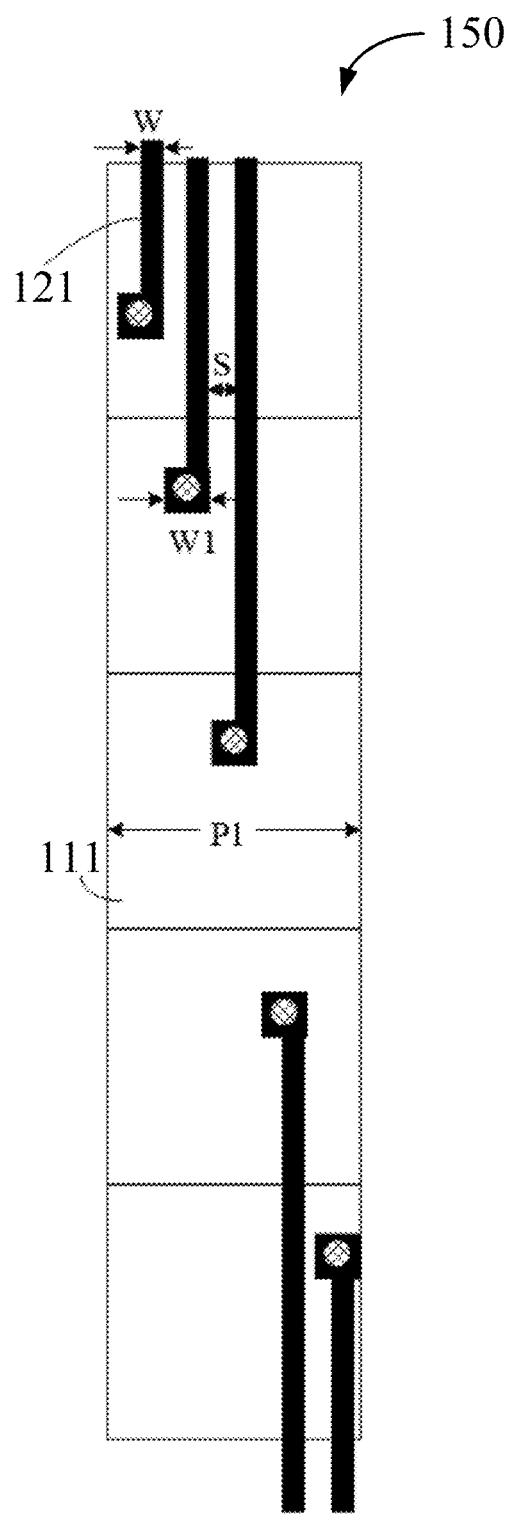
FIG. 1C shows a schematic view of wiring of a column of light-emitting points in a light-emitting unit, for example, one of the three light-emitting units of FIG. 1B.

FIG. 1A depicts a schematic diagram 100 of wiring in a conventional light field display device, FIG. 1B depicts a schematic diagram 125 of wiring in three light-emitting units in a column of the conventional light field display device of FIG. 1A, and FIG. 1C depicts a schematic diagram 150 of wiring of a column of light-emitting points in a light-emitting unit, for example, one of the three light-emitting units of FIG. 1B. With reference to FIGS. 1A-1C, the light field display device includes a plurality of light-emitting units 110 (for example, a quadrilateral area defined by vertices A, B, C, and D is one light-emitting unit 110), and each of the light-emitting units 110 includes a plurality of light-emitting points 111 (for example, each smaller quadrilateral area within the light-emitting unit 110 is one light-emitting point 111). The light-emitting point 111 may be, in some examples, a pixel. In other examples, the light-emitting point 111 may be a subpixel. An electrode is disposed in each of the light-emitting points 111, and the electrode is connected to the second signal line 122 through the first signal line 121. Further, the plurality of first signal lines 121 are disposed in one layer of an insulating spacer. A driving structure supplies a driving signal to the light-emitting points 111 through each of the first signal lines 121 and the second signal lines 122. The light-emitting units 110 are disposed in a column, the first signal lines 121 extending in a direction of the column of the light-emitting units 110, and each light-emitting unit 110 includes 5×5 light-emitting points 111. As such, each column of light-emitting points 111 corresponds to 5 first signal lines 121. Assuming that a width of the first signal line 121 is W, a spacing between two adjacent first signal lines 121 is S, and a width of a connection region of the electrode and the first signal line 121 is W1, then a size of each of the light-emitting points 111 is P1=4W+5S+W1. In one example, W=2.5 µm, S=2.5 µm, W1=5 µm, and P1=27.5 µm, such that the pixel resolution of the light field display device is 25400/(3*27.5) =307 pixels per inch (PPI).

Figure 2:
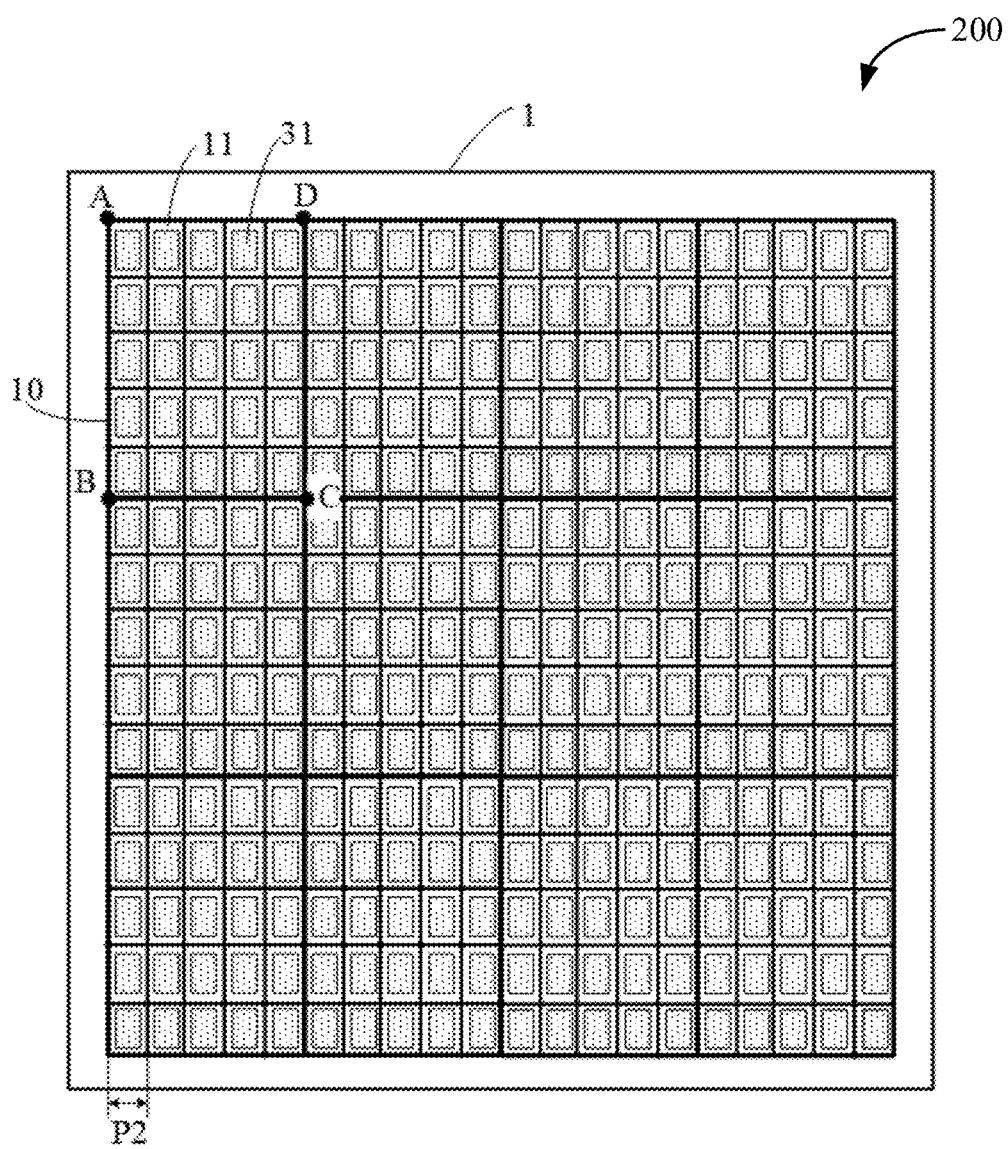
FIG. 2 shows a schematic diagram of an electrode distribution on a substrate according to an embodiment of the present disclosure.
Figure 3A:
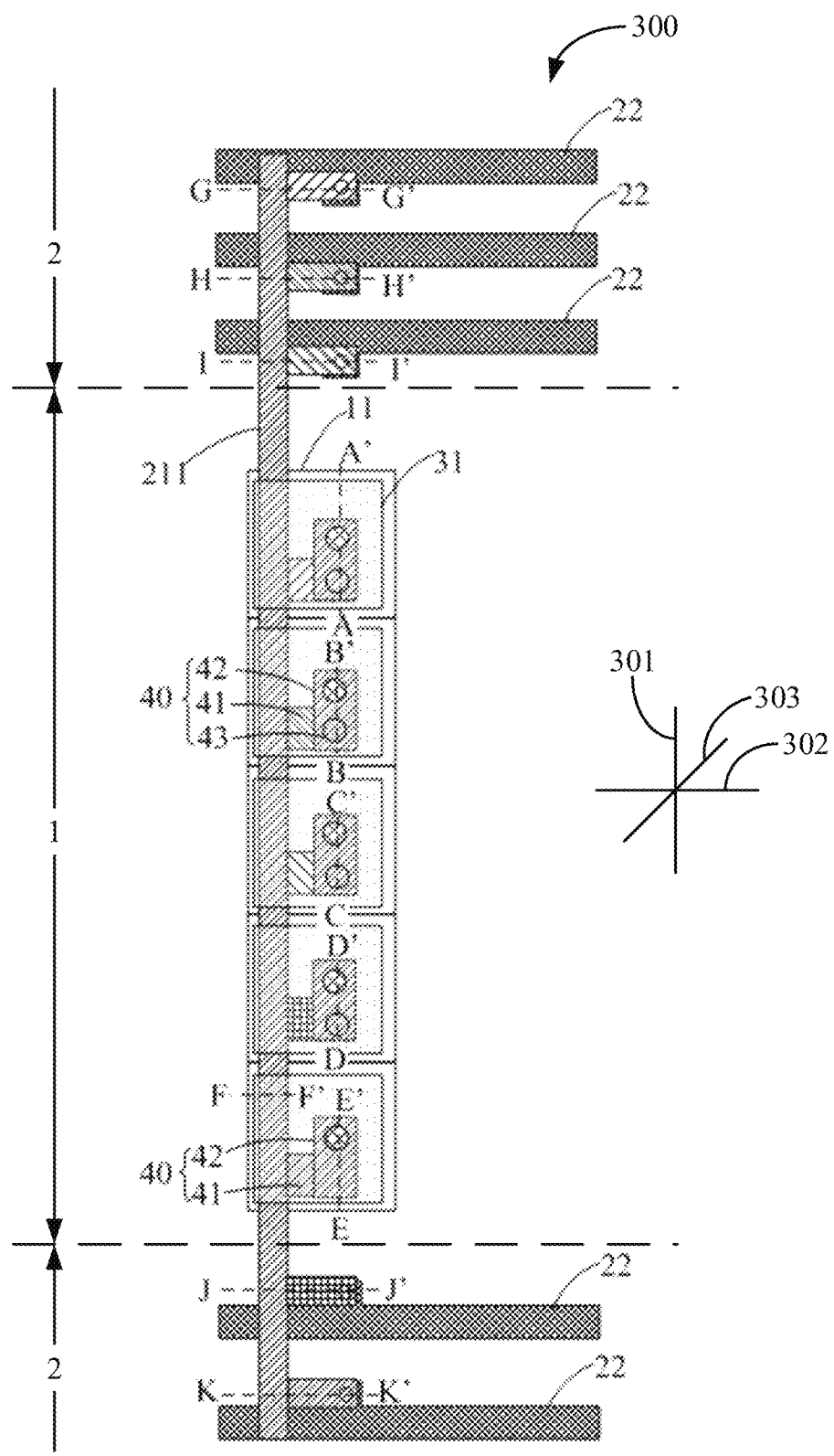
FIG. 3A shows a schematic diagram of connections between five light-emitting points, a first signal line, and a second signal line on the substrate of FIG. 2.
Figure 3B:
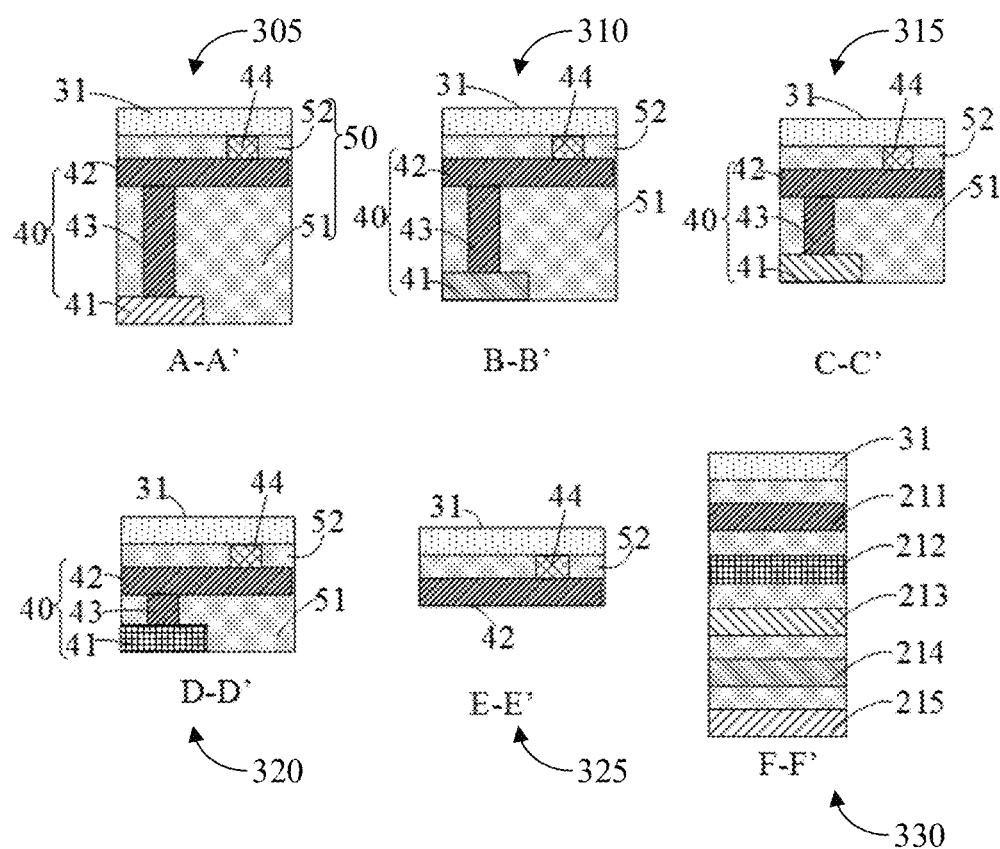
FIG. 3B shows cross-sectional views along lines A-A', B-B', C-C', D-D', E-E', and F-F' of FIG. 3A.
Figure 3C:
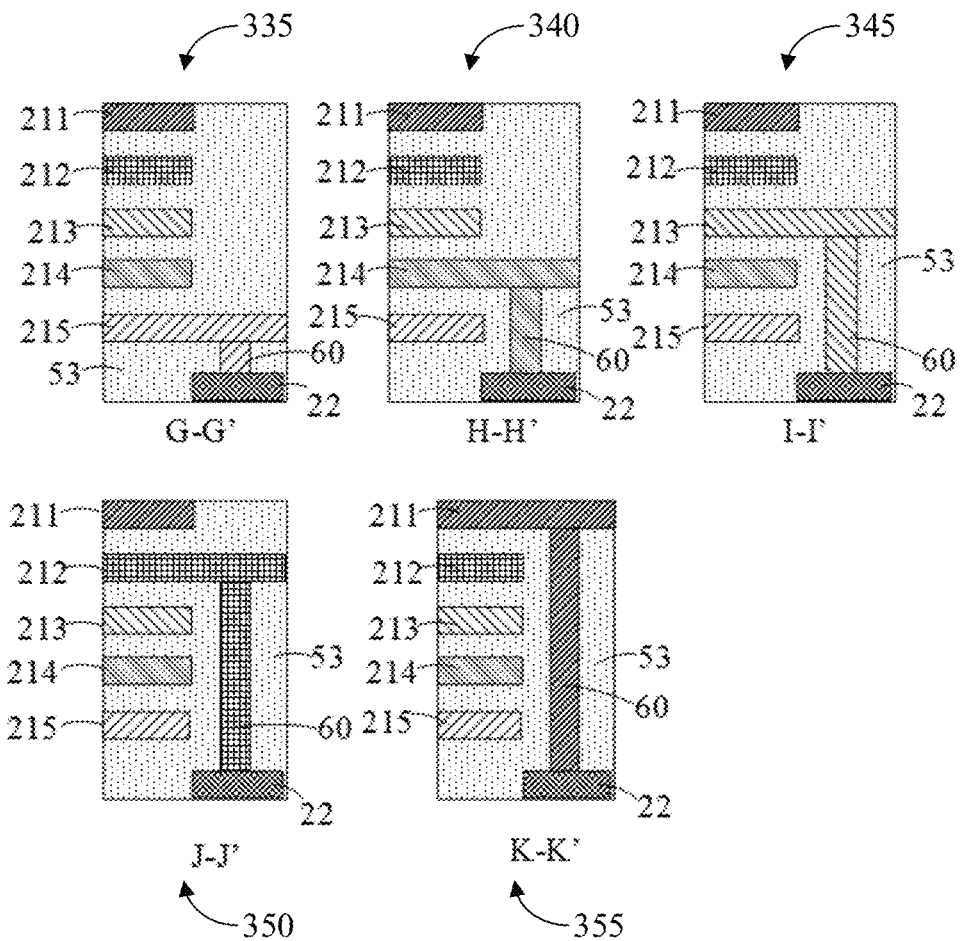
FIG. 3C shows cross-sectional views along lines G-G', H-H', I-I', J-J', and K-K' of FIG. 3A.
Figure 7:
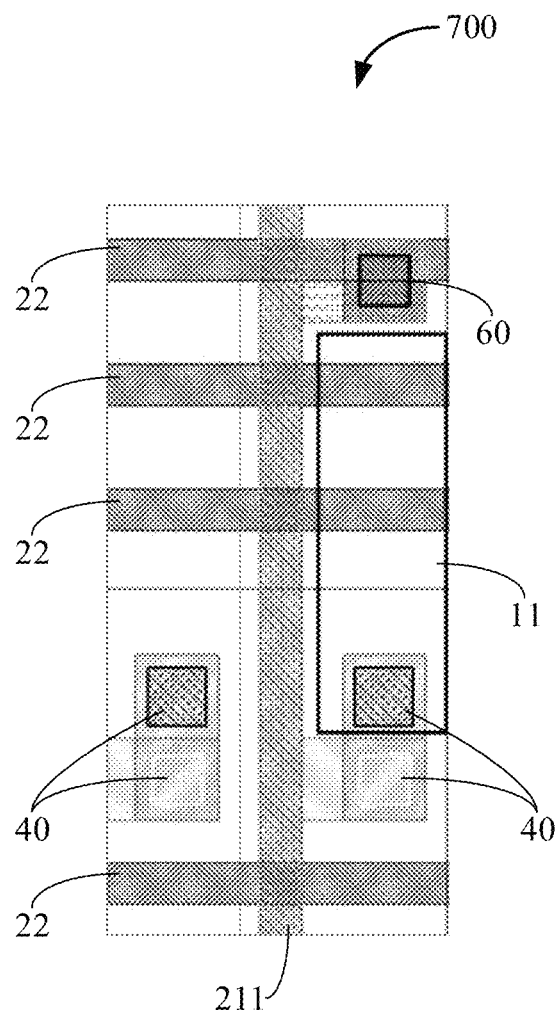
FIG. 7 shows a schematic diagram of connections between a light-emitting point, a first signal line, and a second signal line on the substrate of FIG. 2.

FIG. 2 depicts a schematic diagram 200 of an electrode distribution on a substrate 1 according to an embodiment of the present disclosure, and FIG. 3A depicts a schematic diagram 300 of connections between five light-emitting points 11 and a first signal line 211 and a second signal line 22 on the substrate 1. FIG. 7 depicts a further schematic diagram 700 showing the connections between light-emitting points 11 and the first signal line 211 and second signal lines 22. FIG. 3B depicts a plurality of cross-sectional views 305, 310, 315, 320, 325, 330 along lines A-A', B-B', C-C', D-D', E-E', F-F', respectively, of FIG. 3A, and FIG. 3C depicts a plurality of cross-sectional views 335, 340, 345, 350, 355 along lines G-G', H-H', I-I', J-J', K-K', respectively, of FIG. 3A. The substrate 1 may be incorporated into an array substrate, such as an array substrate for a light field display device (as described below with reference to FIG. 5). With reference to FIGS. 2-3C, the array substrate may be divided into a plurality of light-emitting units 10, each of which includes a plurality of light-emitting points 11, and each of the light-emitting points 11 may be provided with a self light-emitting device (for example, an organic light-emitting diode, or OLED). A plurality of electrodes 31 and a plurality of first signal lines 211, 212, 213, 214, 215 are disposed on the substrate 1, where the electrodes 31 may be anodes of the light-emitting devices, and cathodes of all of the light-emitting devices may be an integrated structure. As such, each of the plurality of the light-emitting points 11 may be configured to be driven by one of the plurality of electrodes 31. Each of the electrodes 31 is connected to one first signal line. The plurality of first signal lines 211 to 215 extend in a like direction, such as along axis 301 or axis 302 of FIG. 3A. Of the plurality of first signal lines 211 to 215, at least two of the first signal lines are located in different layers of an insulating spacer 50, and at least two of the first signal lines in the different layers overlap at least partially on the substrate 1. An example in which five first signal lines 211 to 215 are overlapped is depicted in cross-sectional view 330 of FIG. 3B.

It should be understood that embodiments of the present disclosure may adopt one or more specific configurations of the conventional light field display device described with reference to FIGS. 1A-1C. For example, light-emitting unit 10 may adopt substantially similar aspects or configurations of light-emitting unit 110, light-emitting point 11 may adopt substantially similar aspects or configurations of light-emitting point 111, etc. It should further be understood that embodiments of the present disclosure may add additional elements, aspects, or other configurations not present in the conventional light field display device described with reference to FIGS. 1A-1C.

FIG. 3A depicts the substrate 1 and a non-display region 2 of the array substrate. The substrate 1 may include the light-emitting units 10, the light-emitting points 11, the electrodes 31, the insulating spacer 50, and the first signal lines (e.g., 211 to 215), as well as connections between the electrodes 31 and the first signal lines, and connecting elements therewith (e.g., 40, 41, 42, 43; as described below with reference to FIGS. 3A-3B and 4). The non-display region 2 may include the second signal lines 22, as well as connections between the first signal lines (e.g., 211 to 215) and the second signal lines 22, and connecting elements therewith (e.g., 60; as described below with reference to FIG. 3C).

The plurality of first signal lines 211 to 215 may not all be located in one layer. Rather, at least two of the first signal lines are disposed in different layers and orthographic projections on the substrate 1 of the at least two first signal lines overlap, that is, the at least two first signal lines are arranged in a stack, and an overall width of the stacked first signal lines is smaller than an overall width of the first signal lines when they are all located in one layer, thereby facilitating reducing a light-emitting point size and thereby increasing a density of the light-emitting points, so as to achieve improved light field display effects.

In one example, "orthographic projection" includes a projection of three spatial dimensions into two spatial dimensions. For example, schematic diagram 300 in FIG. 3A is an orthographic projection of a three-dimensional space defined by axes 301, 302, and 303 to a two-dimensional space defined by axes 301 and 302 (where the axes 301 and 302 are in the plane of FIG. 3A, and the axis 303 is orthogonal to the plane of FIG. 3A). Further, "overlap" may refer to one element partially or completely obscuring another in an orthographic projection. For example, the first signal line 211 overlaps the first signal lines 212 to 215 completely in FIG. 3A. As another example, the first signal line 211 partially overlaps the second signal lines 22 shown in FIG. 3A.

Figure 9C:
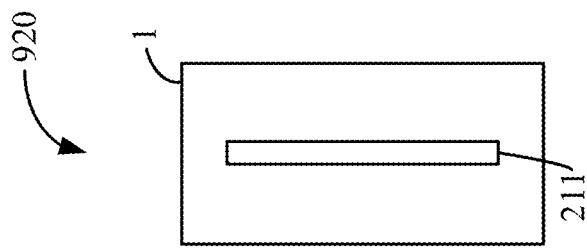
FIG. 9C shows a top view of a second example of the five first signal lines and the substrate from FIG. 9A.
Figure 9C:
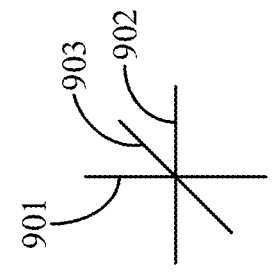
Figure 9B:
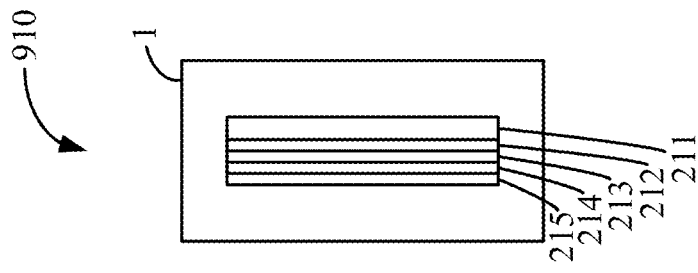
FIG. 9B shows a top view of a first example of the five first signal lines and the substrate from FIG. 9A.
Figure 9B:
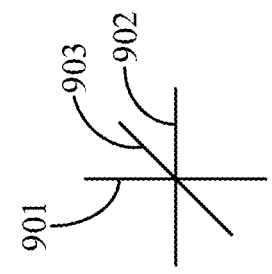
Figure 9A:
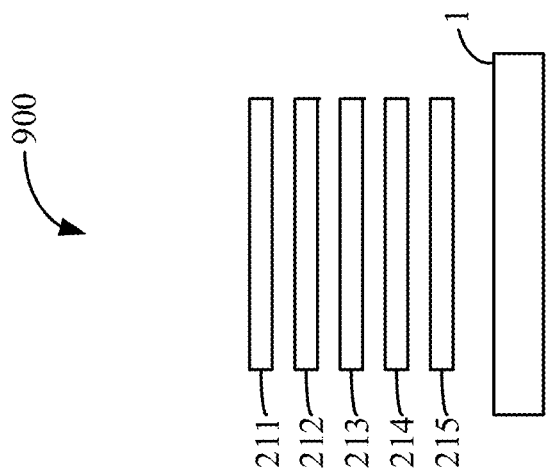
FIG. 9A shows a side view of five first signal lines and a substrate according to an embodiment of the present disclosure.
Figure 9A:
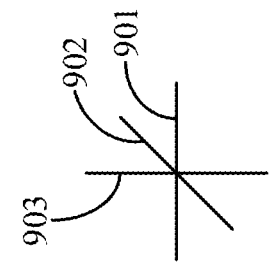

As a further example, FIGS. 9A-9C depict views of the five first signal lines 211 to 215 and the substrate 1. In the examples shown by FIGS. 9A-9C, it will be understood that each of the five first signal lines 211 to 215 are of equivalent dimensions to one another. In other examples in the present disclosure, each of the five first signal lines may have substantially similar, but not necessarily equivalent, dimensions to one another. In other examples in the present disclosure, each of the five first signal lines may have substantially different dimensions to one another. FIG. 9A depicts a side view 900 of the five first signal lines 211 to 215 and the substrate 1. A plane of the side view 900 may be defined by axes 901 and 903. Axis 902 is orthogonal to the plane of the side view 900. FIG. 9B depicts a top view 910 showing a first example of the five signal lines 211 to 215 and the substrate 1 depicted in FIG. 9A. A plane of the top view 910 may be defined by the axes 901 and 902. Axis 903 is orthogonal to the plane of the top view 910. In the first example of FIG. 9B, an orthographic projection on the substrate 1 of the first signal line 211 partially overlaps an orthographic projection on the substrate 1 of the first signal line 212. Further, an orthographic projection on the substrate 1 of the first signal line 212 partially overlaps an orthographic projection on the substrate 1 of the first signal line 213, and so on. FIG. 9C depicts a top view 920 showing a second example of the five signal lines 211 to 215 and the substrate 1 depicted in FIG. 9A. A plane of the top view 920 may be defined by the axes 901 and 902. Axis 903 is orthogonal to the plane of the top view 920. In the second example of FIG. 9C, an orthographic projection on the substrate 1 of the first signal line 211 completely overlaps orthographic projections on the substrate 1 of the first signal lines 212 to 215. As such, the first signal lines 212 to 215 are not visible in the top view 920.

Returning to the discussion of FIGS. 2-3C and 7, the array substrate may be divided into a plurality of light-emitting units 10 arranged in a matrix, such as in FIG. 2. Further, the light-emitting points 11 in each light-emitting unit 10 are arranged in a matrix, or array, that is, the electrodes 31 are arranged in a matrix. The plurality of electrodes 31 are divided into a plurality of groups, where each group includes a further plurality of electrodes 31, and the further plurality of electrodes 31 in a given group are sequentially arranged along the extending direction of the first signal lines 211 to 215. The first signal lines 211 to 215 may be extended in a vertical direction (that is, a column direction of the matrix of electrodes 31), as shown in FIGS. 3A and 3B. The electrodes 31 in a given column may be considered as one group. Of course, in a specific implementation, the first signal lines 211 to 215 may also be extended in a horizontal direction (that is, a row direction of the matrix of electrodes 31). Each electrode 31 in a given group may be connected to one of a corresponding plurality, or second plurality, of first signal lines, wherein the corresponding plurality of first signal lines may be one or more of the plurality, or first plurality, of first signal lines 211 to 215, a subset of the plurality of first signal lines 211 to 215, and another plurality of first signal lines not including first signal lines 211 to 215.

It should be noted that though each of the electrodes 31 is connected to a first signal line (e.g., 211), that does not necessarily mean that the first signal lines to which different electrodes 31 are connected are different from each other. For example, among two light-emitting units 10 in one column, the electrode 31 of the light-emitting point 11 of an $m^{th}$ row and an $n^{th}$ column of one of the light-emitting units 10 may be connected to the same first signal line (e.g., 211) as the light-emitting point 11 of an $m^{th}$ row and an $n^{th}$ column of another light-emitting unit 10. Any two light-emitting points 11 in different light-emitting units 10 may be considered to have a like position if the two light emitting points 11 are each in an $m^{th}$ row and an $n^{th}$ column of each respective light-emitting unit 10. Similarly, any two electrodes 31 in different light-emitting units 10 may be considered to have a like position if the two electrodes 31 are each in an $m^{th}$ row and an $n^{th}$ column of each respective light-emitting unit 10.

In some examples, among the plurality of first signal lines 211 to 215 to which any one of the electrodes 31 is connected, any two of the first signal lines 211 to 215 are located in different layers of the insulating spacer 50, and orthographic projections on the substrate 1 of any two of the first signal lines 211 to 215 in the different layers at least partially overlap. In this way, a total width of the area occupied by a plurality of first signal lines (e.g., 211 to 215) corresponding to each group (e.g., each column) of the electrodes 31 can be reduced. For example, as shown in FIGS. 3A and 3B, the five first signal lines 211 to 215 connected to a column of the electrodes 31 are located in different layers spaced apart from each other, and orthographic projections on the substrate 1 of the five first signal lines 211 to 215 overlap (such that only first signal line 211 is visible in FIGS. 3A and 7). As another example, the three first signal lines 211 to 213 may be located in different layers spaced apart from each other, and orthographic projections on the substrate 1 of any two of the three first signal lines 211 to 213 overlap.

In some examples, each of the plurality of first signal lines 211 to 215 connected to each of the electrodes 31 are located in a different layer of the insulating spacer 50, and orthographic projections on the substrate 1 of any two of the first signal lines at least partially overlap. That is, all of the plurality of first signal lines 211 to 215 connected to the electrode 31 of the same column of the light-emitting points 11 are stacked, thereby further reducing the area occupied by the first signal lines 211 to 215.

Specifically, a plurality of first signal lines (e.g., 211 to 215) connected to a group of electrodes 31 are orthographically projected on the substrate 1 in a projection area, and a width of the projection area is equal to a maximum width of the first signal lines 211 to 215. As such, a total width of the plurality of first signal lines 211 to 215 connected to the group of electrodes 31 on the substrate 1 is a width of the first signal line having a largest width, and thereby a total width of the plurality of first signal lines 211 to 215 is minimized. When each width of the first signal lines 211 to 215 is equivalent, the first signal lines 211 to 215 to which the same group of electrodes 31 are connected are located along a single straight path. It should be understood that when the first signal lines 211 to 215 extend in the vertical direction (that is, the column direction of the matrix of electrodes 31), the width of the projection area and the width of the first signal lines 211 to 215 are each along the horizontal direction (that is, the row direction of the matrix of electrodes 31).

The plurality of electrodes 31 may be disposed in one layer, and each of the first signal lines 211 to 215 may be located between the layer where the plurality of electrodes 31 is located and the substrate 1, as shown in FIG. 3B.

As shown in FIGS. 3A and 3B, each of the electrodes 31 is connected to a corresponding first signal line (e.g., one of 211 to 215) through a first connecting member 40. The first connecting member 40 is located on one side of the first signal lines 211 to 215 in a width direction thereof. In some examples, the first connecting member 40 is made of a metal material having a relatively high electrical conductivity.

Specifically, the first connecting member 40 includes a first connecting portion 41 and a second connecting portion 42. The first connecting portion 41 and a correspondingly connected first signal line (e.g., 211) are disposed in a first layer, and the second connecting portion 42 is connected to the corresponding electrode 31.

More specifically, the second connecting portion 42 is disposed in the same layer as the first signal line 211 farthest from the substrate 1. That is, the first signal line 211 farthest from the substrate 1 and its corresponding first connecting portion 41 and second connecting portion 42 are disposed in a second layer and are directly connected. It should be understood that, on the substrate 1, there may be a plurality of first signal lines in the layer in which each of the first signal lines 211 to 215 is located, that is, the number of the first signal lines disposed in the same layer as the first connecting portion 41 may be more than one.

As shown in FIG. 3B, the insulating spacer 50 may at least include a first insulating layer 51. In some embodiments, the insulating spacer 50 may further include a second insulating layer, such as second insulating layer 53 shown in FIG. 3C. As further shown in FIG. 3B, the insulating spacer 50 may further include a third insulating layer 52. The first insulating layer 51 is disposed between the first connecting portion 41 and the second connecting portion 42, corresponding to the remaining first signal lines 212 to 215 (that is, excepting the first signal line 211 farthest from the substrate 1). The first insulating layer 51 is provided with a first via hole, and the second connecting portion 42 is connected to the corresponding first connecting portion 41 by a third connecting portion 43 filled in the first via hole.

At the time of fabrication, the conductive metal material is filled in the first via hole to form the third connecting portion 43. Thereafter, a tip end of the third connecting portion 43 is ground to be flush with the first via hole by chemical mechanical polishing. The second connecting portion 42 is then formed. As compared with a process in which the second connecting portion 42 is directly connected to the first connecting portion 41 through the first via hole, providing the third connecting portion 43 can prevent the second connecting portion 42 from being broken when the first via hole is too deep, thereby ensuring connection reliability and also making the connecting position flatter.

It should be understood that the first connecting portion 41 is in the same layer as a corresponding first signal line (e.g., 212, 213, 214, 215) and the second connecting portion 42 is in the same layer as the first signal line 211 farthest from the substrate 1. As such, when layers of the plurality of first signal lines 211 to 215 corresponding to the electrodes 31 of the same column are different from each other, the respective thicknesses of the first insulating layers 51 between the first connecting portion 41 and the second connecting portion 42 corresponding to the different first signal lines are also different. Correspondingly, the depths of the first via holes corresponding to electrodes 31 of the same column are different from each other. In this case, to ensure connection reliability between the third connecting portion 43 and each of the corresponding second connecting portion 42 and the first connecting portion 41, a given first via hole having a relatively larger depth may be formed by etching a plurality of times, and the third connecting portion 43 may be deposited in stages.

Figure 4:
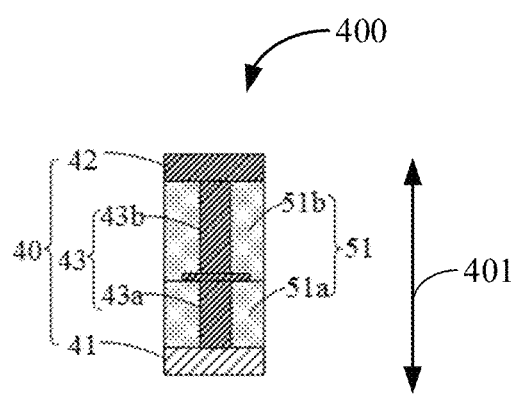
FIG. 4 shows a schematic view of a third connecting portion being formed in a divided manner.

To that end, FIG. 4 depicts a schematic view 400 showing structure of an array substrate (as described below with reference to FIG. 5) when the third connecting portion 43 is formed in stages. As shown in FIG. 4, at least one first via hole includes at least two sub-via holes arranged and connected along an axial direction thereof (such as along axis 401), and each of the sub-via holes is filled with a sub-portion of the third connecting portion 43. At the time of fabrication, after forming a first partial film layer 51a of the first insulating layer 51, a first sub-via hole is formed on the first partial film layer 51a, and a first sub-portion 43a of the third connecting portion 43 is formed in the first sub-via hole. Thereafter, a second partial film layer 51b of the insulating layer 51 is formed and a second sub-via hole is formed on the second partial film layer 51b, and a second sub-portion 43b of the third connecting portion 43 is formed in the second sub-via hole. It should be understood that the number of sub-via holes (and corresponding fabrication stages) may be more than two.

Returning to FIGS. 3A-3C and 7, to connect the second connecting portion 42 and the electrode 31, a via hole may be formed on the third insulating layer 52 between the second connecting portion 42 and the electrode 31, whereby the electrode 31 may be connected to the second connecting portion 42 through the via hole. As shown in FIG. 3B, a fourth connecting portion 44 is filled in the via hole, and the electrode 31 is connected to the second connecting portion 42 by the fourth connecting portion 44.

The above is a description of an arrangement and connection manner of the first signal line (e.g., 211) and the electrode 31 on the substrate 1. In addition, in one embodiment, the substrate 1 is further provided with a driving structure (not shown) and a plurality of second signal lines 22. As shown in FIG. 3C, the driving structure supplies a driving signal to the first signal lines 211 to 215 through the plurality of second signal lines 22, thereby supplying a driving signal to the electrode 31. Here, as also shown in FIGS. 3A and 7, the first signal line 211 and an extending direction of the second signal line 22 intersect. As shown in FIGS. 3A and 3B, the first signal lines 211 to 215 are located on along a single straight path and are stacked, that is, extending directions of the first signal lines 212 to 215 and the second signal line 22 also intersect. Each of the electrodes 31 corresponds to a second signal line 22 and is connected to the corresponding second signal line 22 through a corresponding first signal line (e.g., 211, 212, 213, 214, 215). It should be noted that each of the electrodes 31 corresponds to one second signal line 22, but each of the second signal lines 22 may correspond to a plurality of the electrodes 31.

Specifically, in any two of the light-emitting units 10 (as depicted, for example, in FIG. 2) arranged along the extending direction of the first signal lines 211 to 215, the electrodes 31 of the two light-emitting points 11 having the same position are connected to the same second signal line 22 through a corresponding first signal line (e.g., 211). In some examples, in any two of the light-emitting units 10 arranged along the extending direction of the first signal lines 211 to 215, each of the electrodes 31 of the two light-emitting points having the same position are correspondingly connected to two first signal lines. In other examples, in any two of the light-emitting units 10 arranged along the extending direction of the first signal lines 211 to 215, the electrodes 31 of the two light-emitting points 11 having the same position are connected to the same first signal line (e.g., 211). Herein, "two light-emitting points 11 having the same position of the two light-emitting units 10" means that two light-emitting points 11 have the same position in two respective light-emitting units 10, for example, in the third row and the third column of one light-emitting unit 10 and in the third row and the third column of another light-emitting unit 10. For the case in which each of the light-emitting units 10 in FIG. 2 includes 5×5 light-emitting points 11, a total of 25 first signal lines (e.g., 211; not shown at FIG. 2) are connected to each column of the light-emitting units 10.

Further, as shown in FIG. 3C, the second insulating layer 53 is disposed between each of the first signal lines 211 to 215 and the corresponding second signal line 22, and a second via hole is disposed on the second insulating layer 53. The first signal lines 211 to 215 and the corresponding second signal lines 22 are connected by second connecting members 60 penetrating through the second via holes.

The plurality of second signal lines 22 are disposed in the same layer. As such, when two first signal lines (e.g., 211, 212, 213, 214, 215) are located in different layers, the thicknesses of the second insulating layers 53 between the two first signal lines and the corresponding second signal lines 22 are different. As shown in cross-sectional view 330 of FIG. 3B, the layers of the plurality of first signal lines 211 to 215 corresponding to the electrode 31 of a given column are different from each other. In this case, as shown in FIG. 3C, the thicknesses of the second insulating layers 53 corresponding to the first signal lines 211 to 215 are different from each other. Similar to fabrication of the first via hole (as described above with reference to FIG. 4), to ensure connection reliability between the second connecting member 60 and the corresponding first signal line (e.g., 211) and the second signal line 22, at least one second via hole may include at least two sub-via holes arranged and connected along an axial direction thereof (such as along axis 401, as shown in FIG. 4), where each of the sub-via holes of the second via hole is filled with a sub-portion of the second connecting member 60. The second via hole includes at least two sub-via holes fabricated in the same manner as the first via hole including at least two sub-via holes, and is not described herein again.

In one embodiment, the first signal lines on the substrate 1 are not all located in the same layer, such that at least two first signal lines are stacked, thereby facilitating reduction of the light-emitting point size. Moreover, the plurality of first signal lines corresponding to the electrode of any one of the columns may be located along a single straight path. Assuming that a width of each of the first signal lines is W, a width of the second connecting portion is W2, and a distance between the first signal line and the second connecting portion is S, then the light-emitting point size in this case is P2=W+2S+W2. Further, when W2 is equal to W1, then P2=W+2S+W1. In one example, W=2.5 μm, S=2.5 μm, W1=5 μm, the light-emitting point size in FIG. 2 is P2=12.5 μm, and the pixel resolution is 25400/(3*12.5)=677 PPI. Compared with conventional light field display devices, the array substrate of the present disclosure significantly improves the pixel resolution.

Figure 5:
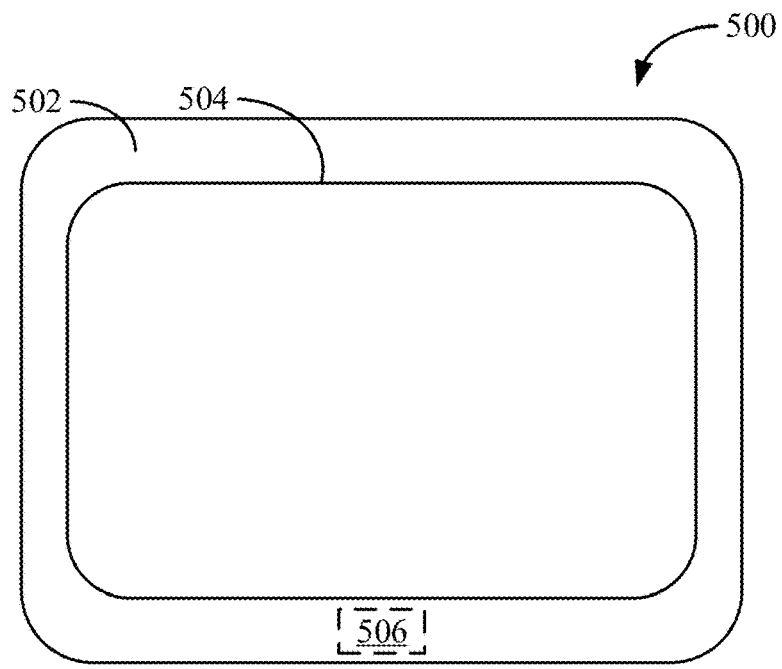
FIG. 5 shows a schematic diagram of a light field display device according to an embodiment of the present disclosure.

According to an embodiment of the present disclosure, FIG. 5 depicts a schematic diagram 500 of a light field display device 502 having an array substrate, or display, 504, where the array substrate 504 comprises the substrate (e.g., 1) described hereinabove. The light field display device may further include a power supplying circuit 506.

The light field display device 502 is configured to implement 3D display via the array substrate 504, wherein a part of the light-emitting unit therein is a left-eye light-emitting unit for displaying a left-eye image, and another part is a right-eye light-emitting unit for displaying a right-eye image. In a horizontal direction relative to a viewer, the left-eye light-emitting units and the right-eye light-emitting units are alternatingly arranged. The power supplying circuit 506 may be configured to supply power from a battery or an external source to the light field display device 502. In some examples, the light field display device 502 may include a light adjustment structure (e.g., a microlens; not shown), wherein the light adjustment structure may be disposed on one side of the substrate, such that the light adjustment structure is disposed on the light-exiting side of the array substrate 504 for adjusting an angle of the light emitted by each of the light-emitting points therein.

Figure 6A:
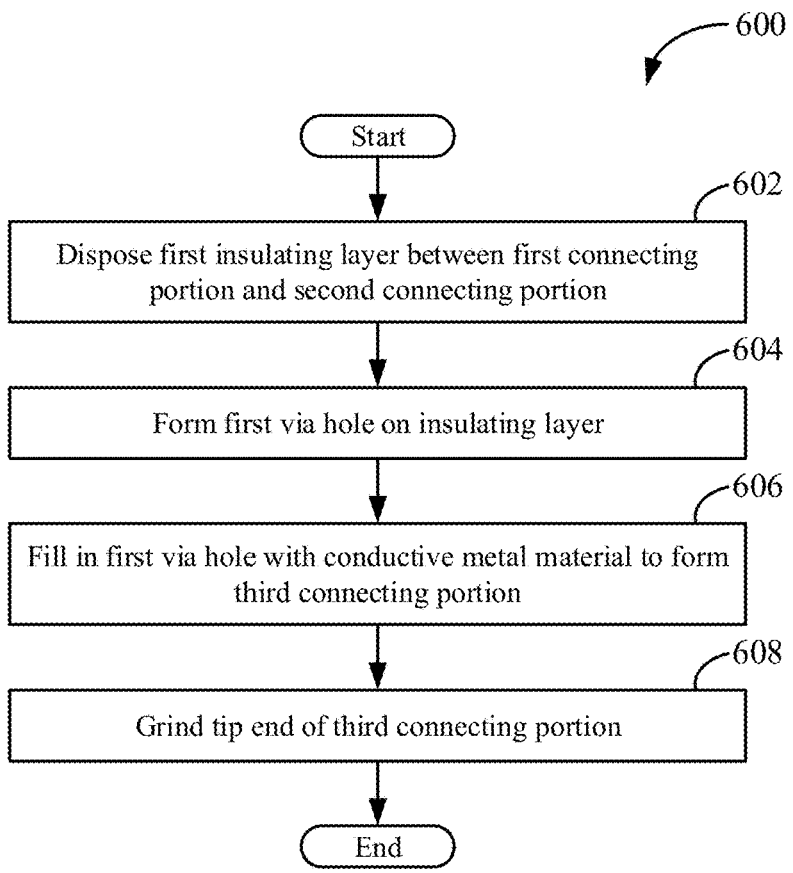
FIG. 6A shows a flow diagram of a fabrication method for a first connecting member in a display according to an embodiment of the present disclosure.
Figure 6B:
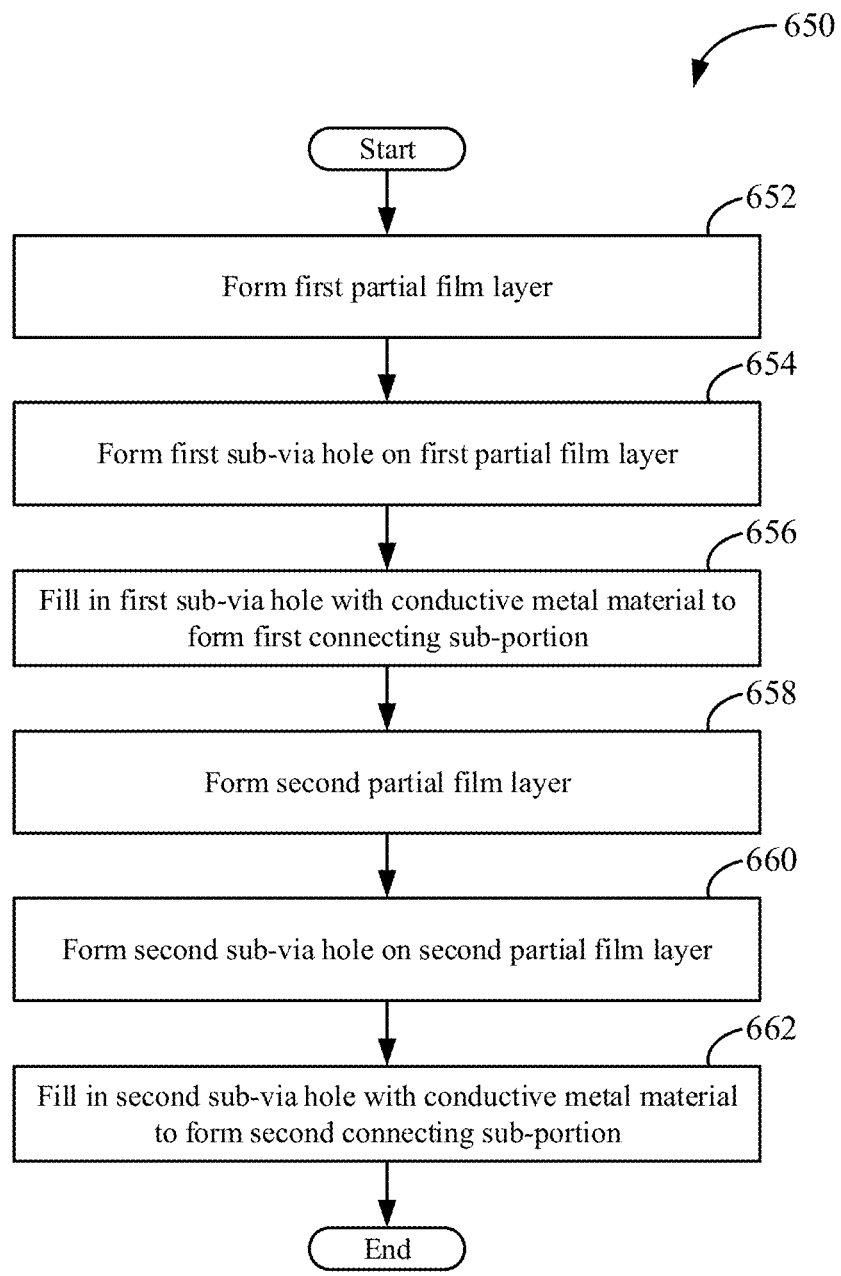
FIG. 6B shows a flow diagram of a fabrication method for a third connecting portion of the first connecting member of FIG. 6A.
Figure 8:
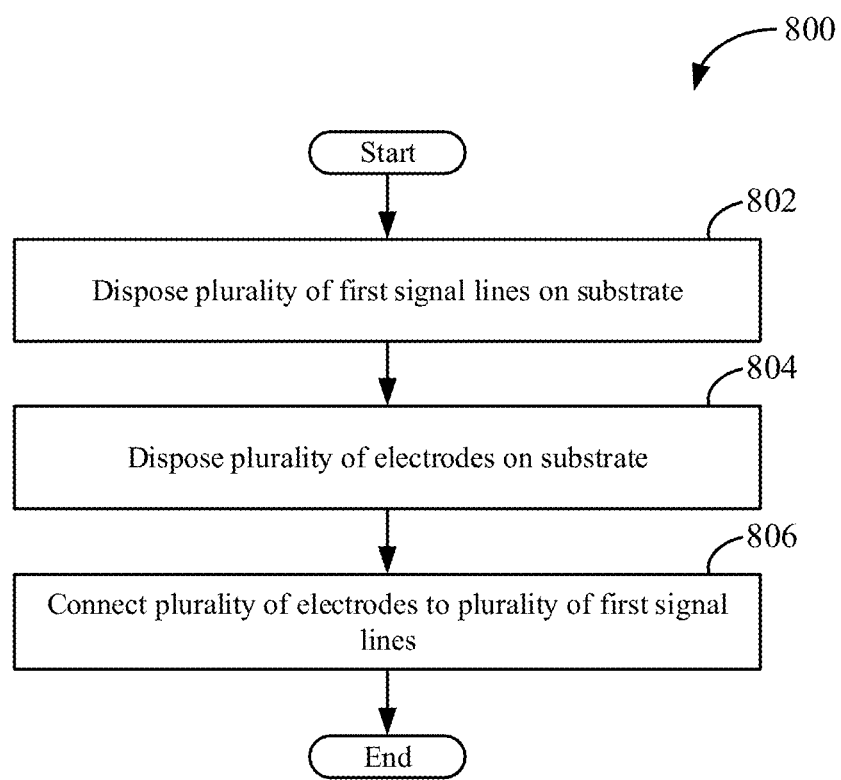
FIG. 8 shows a flow diagram of a fabrication method for an array substrate according to an embodiment of the present disclosure.

FIGS. 6A, 6B, and 8 describe fabrication methods for the array substrate (e.g., 504) according to an embodiment of the present disclosure. It should be understood that elements of the described fabrication methods may be combined with one another to obtain more specific embodiments. For example, aspects of the fabrication method described with reference to FIG. 6A may be utilized in the fabrication method described with reference to FIG. 8.

FIG. 6A depicts a flow diagram 600 of a fabrication method for the first connecting member (e.g., 40; as described above with reference to FIGS. 3A, 3B, 4, and 7) of the array substrate (e.g., 504) according to an embodiment of the present disclosure. At 602, the first insulating layer (e.g., 51) may be disposed between the first connecting portion (e.g., 41) and the second connecting portion (e.g., 42) of the first connecting member. At 604, the first via hole may be formed on the first insulating layer. At 606, the first via hole may be filled with conductive metal material to form the third connecting portion (e.g., 43) of the first connecting member. At 608, tip ends of the third connecting portion adjacent to the first connecting portion and the second connecting portion may be ground to be flush with the first via hole by chemical mechanical polishing.

FIG. 6B depicts a flow diagram 650 of a fabrication method for the third connecting portion (e.g., 43; as described above with reference to FIGS. 3A-3B and 4) of the first connecting member (e.g., 40) of the array substrate (e.g., 504) according to an embodiment of the present disclosure. At 652, the first partial film layer (e.g., 51a) of the first insulating layer (e.g., 51) may be formed. At 654, the first sub-via hole may be formed on the first partial film layer. At 656, the first sub-via hole may be filled with conductive metal material to form the first connecting sub-portion (e.g., 43a) of the third connecting portion. At 658, the second partial film layer (e.g., 51b) of the first insulating layer may be formed. At 660, the second sub-via hole may be formed on the second partial film layer. In some examples, the second sub-via hole may be arranged and connected with the first sub-via hole along an axial direction thereof (such as along axis 401, as shown in FIG. 4). At 662, the second sub-via hole may be filled with conductive metal material to form the second connecting sub-portion (e.g., 43b) of the third connecting portion. A first fabrication stage may comprise 652, 654, and 656, and a second fabrication stage may comprise 658, 660, and 662. It should be understood that the number of sub-via holes (and corresponding fabrication stages) may be more than two. Alternatively, the third connecting portion may be formed in a single fabrication stage, such as that described above with reference to FIG. 6A.

FIG. 8 depicts a flow diagram 800 of a fabrication method for the array substrate (e.g., 504) according to an embodiment of the present disclosure. At 802, the plurality of first signal lines (e.g., 211 to 215) may be disposed on the substrate (e.g., 1). The plurality of first signal lines may extend along a direction of an axis, such as along a planar axis (e.g., 301, 302) of the substrate. In some examples, of the plurality of first signal lines, at least two first signal lines may be located in different layers of the insulating spacer (e.g., 50). In other examples, of the plurality of first signal lines, each first signal line may be located in different layers of the insulating spacer. Further, orthographic projections of the first signal lines in the different layers of the insulating spacer may partially, or completely, overlap. At 804, the plurality of electrodes (e.g., 31) may be disposed on the substrate. At 806, the plurality of electrodes may be connected to the plurality of first signal lines.

In this way, the array substrate provided hereinabove can reduce the light-emitting point size and thereby increase the density distribution of the light-emitting points. The technical effect of the light field display device utilizing the array substrate is that the light field display device can achieve an improved display effect as compared to conventional light field display devices.

In one example, an array substrate, comprising: a substrate; a plurality of electrodes on the substrate; and a plurality of first signal lines on the substrate; wherein each of the plurality of electrodes is connected to one of the plurality of first signal lines; the plurality of first signal lines extends along a first direction; at least two first signal lines of the plurality of first signal lines are located in different layers of an insulating spacer from each other, and orthographic projections on the substrate of the at least two first signal lines in the different layers at least partially overlap.

Optionally, the array substrate, wherein the plurality of electrodes are arranged in a first matrix; the first direction is a row direction or a column direction of the first matrix; the plurality of electrodes are divided into a plurality of groups, each group comprising at least two of the plurality of electrodes arranged along the first direction; and at least two first signal lines of the plurality of first signal lines are connected to at least two electrodes in one group, being located in different layers of the insulating spacer from each other, and orthographic projections on the substrate of any of the at least two first signal lines in one group and in the different layers at least partially overlap.

Optionally, the array substrate, wherein any two of the first signal lines in one group are located in different layers of the insulating spacer from each other, and orthographic projections on the substrate of any two first signal lines at least partially overlap.

Optionally, the array substrate, wherein the at least two first signal lines in one group are orthographically projected on the substrate in a projection area, a width of the projection area being equal to a maximum width of the at least two first signal lines in one group.

Optionally, the array substrate, wherein each of the plurality of electrodes is connected to one of the plurality of first signal lines through a first connecting member, the first connecting member being located at a side of the one of the plurality of first signal lines along a direction of a width of the one of the plurality of first signal lines.

Optionally, the array substrate, wherein the first connecting member comprises a first connecting portion and a second connecting portion, the first connecting portion and a correspondingly connected first signal line being disposed in a first layer, and the second connecting portion being connected to a corresponding electrode.

Optionally, the array substrate, wherein the second connecting portion and a first signal line farthest from the substrate are disposed in a second layer; and a first insulating layer is disposed between the first connecting portion and the second connecting portion, the first insulating layer corresponding to first signal lines excepting the first signal line farthest from the substrate, and the first insulating layer being provided with a first via hole, wherein the second connecting portion is correspondingly connected to the first connecting portion through a third connecting portion filled in the first via hole.

Optionally, the array substrate, wherein at least one of the first via holes comprises at least two first sub-via holes arranged and connected along an axial direction thereof, each of the first sub-via holes being filled with a sub-portion of the third connecting portion.

Optionally, the array substrate, further comprising a plurality of second signal lines, intersecting with the plurality of first signal lines in a non-display region, wherein each of the plurality of electrodes corresponds to one of the plurality of second signal lines; and each of the plurality of electrodes is connected to the corresponding second signal line through a corresponding one of the plurality of first signal lines.

Optionally, the array substrate, further comprising a plurality of light-emitting units arranged in a second matrix, each of the plurality of light-emitting units comprising a plurality of light-emitting points arranged in a third matrix, wherein each of the plurality of light-emitting points is configured to be driven by one of the plurality of electrodes; and of any two of the plurality of light-emitting units arranged along the first direction, each two electrodes having a same position in any two corresponding third matrices are connected to a same second signal line through two corresponding first signal lines.

Optionally, the array substrate, further comprising a plurality of light-emitting units arranged in a second matrix, each of the plurality of light-emitting units comprising a plurality of light-emitting points arranged in a third matrix, wherein each of the plurality of light-emitting points is configured to be driven by one of the plurality of electrodes; and of any two of the plurality of light-emitting units arranged along the first direction, each two electrodes having a same position in any two corresponding third matrices are connected to a same second signal line through a same first signal line.

Optionally, the array substrate, wherein a second insulating layer is disposed between the corresponding first signal line and the corresponding second signal line, the second insulating layer being provided with a second via hole, wherein the corresponding first signal line and the corresponding second signal line are connected by a second connecting member extending through the second via hole.

Optionally, the array substrate, wherein at least one of the second via holes comprises at least two second sub-via holes arranged and connected along an axial direction thereof, and each of the second sub-via holes being filled with a sub-portion of a fourth connecting portion.

Optionally, the array substrate, wherein at least five first signal lines of the plurality of first signal lines are located in different layers of the insulating spacer from each other, and orthographic projections on the substrate of the at least five first signal lines in the different layers completely overlap.

Optionally, a light field display device comprising the array substrate, and further comprising a power supplying circuit.

It should be noted that, in the present disclosure, "connected" and "connection" refer to electrical connection; "disposed/located in the same layer" means that two structures are made by a synchronous process at the time of fabrication, and do not necessarily mean a distance to the substrate is equivalent; and an "extension direction" of a signal line refers to an overall course of the signal line.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

It is to be understood that the above embodiments are merely exemplary embodiments employed to explain the principles of the inventive concepts, but the inventive concepts are not limited thereto. Various modifications and improvements can be made by those skilled in the art without departing from the spirit and scope of the disclosure, and such modifications and improvements are also considered to be within the scope of the disclosure.

The invention claimed is:

1. An array substrate, comprising:
   a substrate;
   a plurality of electrodes on the substrate; and
   a plurality of first signal lines on the substrate, wherein
      at least one of the plurality of electrodes is connected to one of the plurality of first signal lines;
      the plurality of first signal lines extends along a first direction; and
      at least two first signal lines of the plurality of first signal lines are located in different layers, and an insulating spacer is provided between the at least two first signal lines that are located in different layers,
   wherein the plurality of electrodes are disposed in one layer.

2. The array substrate according to claim 1, wherein at least three first signal lines of the plurality of first signal lines are located in different layers, and orthographic projections on the substrate of the at least three first signal lines in the different layers at least partially overlap.

3. The array substrate according to claim 1, wherein the at least two first signal lines located in different layers have different distances from the substrate.

4. The array substrate according to claim 1, wherein the plurality of first signal lines are divided into a plurality of groups, each group comprises at least two of the plurality of first signal lines arranged along the first direction, and orthographic projections on the substrate of any of the at least two first signal lines in one group and in the different layers at least partially overlap.

5. The array substrate according to claim 4, wherein a plurality of first connecting members are provided for the at least two of the plurality of first signal lines in one group, each of the plurality of electrodes is connected to one of the plurality of first signal lines through one of the plurality of first connecting members, the plurality of first connecting members are located at a side of the one of the plurality of first signal lines along a direction of a width of the one of the plurality of first signal lines.

6. The array substrate according to claim 5, wherein the first connecting member comprises a plurality of connecting portions, one of the plurality of connecting portions is located in a same layer as the first signal line connected with the first connecting member.

7. The array substrate according to claim 6, wherein the plurality of connecting portions comprises a first connecting portion and a second connecting portion, the first connecting portion and a correspondingly connected first signal line is disposed in a first layer, and the second connecting portion is connected to a corresponding electrode.

8. The array substrate according to claim 5, wherein the first connecting members for each of plurality of groups are located at a same side of the first signal lines in each of plurality of groups.

9. The array substrate according to claim 4, further comprising a plurality of second signal lines, wherein the plurality of second signal lines intersects with the plurality of first signal lines, wherein
   each of the plurality of electrodes corresponds to one of the plurality of second signal lines; and
   each of the plurality of electrodes is connected to the corresponding second signal line through a corresponding one of the plurality of first signal lines,
   wherein at least two of the plurality of second signal lines are arranged at opposite sides of electrodes that are connected to the at least two of the plurality of second signal lines.

10. The array substrate according to claim 9, wherein the insulating spacer comprises a first insulating layer and a second insulating layer, the array substrate further comprises a third insulating layer, the first insulating layer comprises a first via hole, the second insulating layer comprises a second via hole, the third insulating layer comprises a third via hole,
    the first connecting member comprises a first connecting portion and a second connecting portion, the first insulating layer is disposed between the first connecting portion and the second connecting portion, the first insulating layer corresponding to first signal lines excepting the first signal line farthest from the substrate, wherein the second connecting portion is correspondingly connected to the first connecting portion through a third connecting portion filled in the first via hole,
    the second insulating layer is disposed between the first signal line and the second signal line, wherein the first signal line and the second signal line are connected by a second connecting member extending through the second via hole,
    the electrode is connected to the second connecting portion through a fourth connecting portion filled in the third via hole.

11. The array substrate according to claim 10, wherein for each of the plurality of first signal lines, at least two of the first via hole, the second via hole, and the third via hole are located at a same side of the first signal line along a direction of a width of the one of the plurality of first signal lines.

12. The array substrate according to claim 9, wherein the plurality of electrodes are arranged in a first matrix; the array substrate further comprises a plurality of light-emitting units arranged in a second matrix, each of the plurality of light-emitting units comprises a plurality of light-emitting points arranged in a third matrix, wherein
    each of the plurality of light-emitting points is configured to be driven by one of the plurality of electrodes; and
    of any two of the plurality of light-emitting units arranged along the first direction, each two electrodes having a same position in any two corresponding third matrices are connected to a same second signal line through a same first signal line or through two corresponding first signal lines.

13. The array substrate according to claim 3, wherein the plurality of electrodes are arranged on a same insulating layer, and are in contact with the insulating layer.

14. The array substrate according to claim 1, wherein a minimum distance between each of the plurality of electrodes and the substrate is greater than a minimum distance between each of the plurality of first signal lines and the substrate.

15. An array substrate, comprising:
a substrate;
a plurality of light-emitting units, each of the plurality of light-emitting units comprising a plurality of light-emitting points, each of the light-emitting points comprises an electrode so that a plurality of electrodes are provided, wherein each of the plurality of light-emitting points is configured to be driven by one of the plurality of electrodes; and
a plurality of first signal lines on the substrate; wherein
at least one of the plurality of electrodes is connected to one of the plurality of first signal lines;
the plurality of first signal lines extends along a first direction;
at least two first signal lines of the plurality of first signal lines are located in different layers, and an insulating spacer is provided between the at least two first signal lines that are located in different layers,
wherein the plurality of electrodes are arranged on a same insulating layer and are in contact with the insulating layer.

16. The array substrate according to claim 15, wherein at least three first signal lines of the plurality of first signal lines are located in different layers, and orthographic projections on the substrate of the at least three first signal lines in the different layers at least partially overlap.

17. The array substrate according to claim 15, wherein a minimum distance between each of the plurality of electrodes and the substrate is greater than a minimum distance between each of the plurality of first signal lines and the substrate.

18. A display device comprising an array substrate and further comprising a power supplying circuit,
wherein the array substrate comprises:
a substrate;
a plurality of electrodes on the substrate; and
a plurality of first signal lines on the substrate; wherein
at least one of the plurality of electrodes is connected to one of the plurality of first signal lines;
the plurality of first signal lines extends along a first direction;
at least two first signal lines of the plurality of first signal lines are located in different layers, and an insulating spacer is provided between the at least two first signal lines that are located in different layers,
wherein a minimum distance between each of the plurality of electrodes and the substrate is greater than a minimum distance between each of the plurality of first signal lines and the substrate.

19. The display device according to claim 18, wherein the display device is a light field display device.

20. The display device according to claim 18, wherein the plurality of electrodes are arranged on a same insulating layer, and are in contact with the insulating layer.

* * * * *

UNITED STATES PATENT AND TRADEMARK OFFICE
CERTIFICATE OF CORRECTION

| | |
|---|---|
| PATENT NO. | : 11,804,514 B2 |
| APPLICATION NO. | : 17/212158 |
| DATED | : October 31, 2023 |
| INVENTOR(S) | : Yang et al. |

It is certified that error appears in the above-identified patent and that said Letters Patent is hereby corrected as shown below:

In the Claims

On Column 14, Line 61 (Claim 13), please change:
"The array substrate according to claim 3, ..."
To correctly read:
-- The array substrate according to claim 1, .... --

Signed and Sealed this
Thirteenth Day of February, 2024

Katherine Kelly Vidal
*Director of the United States Patent and Trademark Office*